United States Patent [19]

Jain et al.

[11] Patent Number: 5,403,780
[45] Date of Patent: Apr. 4, 1995

[54] METHOD ENHANCING PLANARIZATION ETCHBACK MARGIN, RELIABILITY, AND STABILITY OF A SEMICONDUCTOR DEVICE

[76] Inventors: Vivek Jain, 697 Calero St., Milpitas, Calif. 95035; Milind G. Weiling, 1265 N. Capitol Ave. #37, San Jose, Calif. 95132; Dipankar Pramanik, 1658 Jamestown Dr., Cupertino, Calif. 95014

[21] Appl. No.: 72,279

[22] Filed: Jun. 4, 1993

[51] Int. Cl.⁶ .............................................. H01L 21/90
[52] U.S. Cl. .................................... 437/195; 437/231; 437/238
[58] Field of Search ............... 437/195, 228, 238, 231; 148/DIG. 43; 156/654

[56] References Cited

U.S. PATENT DOCUMENTS

| | | | |
|---|---|---|---|
| 4,986,878 | 1/1991 | Malazgirt et al. | 156/643 |
| 5,128,279 | 7/1992 | Nariani et al. | 437/195 |
| 5,252,515 | 10/1993 | Tsai et al. | 437/195 |
| 5,603,062 | 3/1991 | Yen | 437/231 |

FOREIGN PATENT DOCUMENTS 0343269  11/1989  European Pat. Off. .

OTHER PUBLICATIONS

Brader et al., J. Electrochem. Soc: Solid-State Science & Tech., Sep. 1988, vol. 135, No. 9, pp. 2291-2294.

*Primary Examiner*—George Fourson
*Assistant Examiner*—Ken Horton

[57] ABSTRACT

Void-free planarization of sub-micron and deep sub-micron semiconductor devices results from depositing a layer of silicon-enriched oxide over a conventionally fabricated device and its metal traces. Conventional layers of TEOS-based oxide and SOG are then applied over the layer of silicon-enriched oxide. The silicon-enriched oxide has an index of refraction of at least about 1.50, a dangling bond density of about $10^{17}/cm^3$, and is typically about 1,000 Å to 2,000 Å thick. Because it is relatively deficient in oxygen atoms, the silicon-enriched oxide releases relatively few oxygen atoms when exposed by the etching process and does not greatly accelerate the SOG etch rate. Further, the silicon-enriched oxide itself has an etch rate that is only about 75% that of stoichiometric TEOS-based oxide. As such, the silicon-enriched oxide acts as a buffer that slows the etch-back process as the etching approaches the level of the metal traces, thus protecting the metal traces against exposure. In addition, the silicon-enriched oxide advantageously promotes stability and reliability of the underlying device. The silicon-enriched performs an shield-like function by neutralizing charges that could influence the underlying semiconductor device. In practice, the silicon-enriched oxide can extend hot carrier lifetime by about one order of magnitude.

12 Claims, 4 Drawing Sheets

METHOD ENHANCING PLANARIZATION ETCHBACK MARGIN, RELIABILITY, AND STABILITY OF A SEMICONDUCTOR DEVICE

FIELD OF THE INVENTION

This invention relates to planarization of semiconductor devices, and more specifically to void-free planarization of sub-micron semiconductor devices, while enhancing device reliability and stability.

BACKGROUND OF THE INVENTION

Adequately planarizing completed integrated circuits ("ICs") presents a formidable challenge when fabricating sub-micron devices, e.g., devices having <1 μm or 10,000 Å horizontal distance between adjacent metal traces. Using well known techniques, ICs are fabricated on a substrate by forming various depositions, layer by layer. For example, an IC containing a metal-oxide-semiconductor ("MOS") device has a thin layer of oxide over which a polysilicon gate is deposited and defined, whereafter source and drain regions are implanted connecting the channel region underlying the gate.

A layer of inter-level dielectric ("ILD") is then formed atop the polysilicon level (and thus over the MOS or other device thereunder). A first level of metal traces is then deposited and defined atop the ILD. A layer of inter-metal-oxide ("IMO") may be formed atop the first level of metal traces, with an overlying second level of metal traces fabricated atop the IMO, for electrical communication though vias with underlying metal one traces.

FIG. 1A depicts generally what has been described, wherein the active device (shown generically as 10) is formed on substrate 20 and covered by ILD layer 30. The nature of device 10 is not important to the present invention, and it is understood that device 10 encompasses MOS, bipolar, bipolar-complementary MOS ("BiCMOS") devices, among others.

Several level one metal traces M1A, M1B, M1C are shown in FIG. 1A. These traces are insulated by an insulating IMO layer 40 from overlying level two metal traces, M2A, M2B. A via 50 is shown electrically coupling level one metal trace M1A with level two metal trace M2A.

The vertical height of the metal 1 traces creates an uneven topography that must be levelled or evened-out to permit a proper deposition of the metal 2 traces. Thus, IMO layer 40 provides electrical insulation between the metal 1 and metal 2 layers, and preferably also provides a planarizing function.

FIG. 2A provides further detail as to the formation of IMO layer 40. Preliminary, the IMO typically comprises at least two separate layers, namely layers 60 and 70, and after planarization is complete the IMO further comprises an additional cap layer 80 (see FIG. 2B). Layer 60 is typically tetra-ethyl-ortho-silicate ("TEOS")-based oxide, formed by plasma enhanced chemical vapor deposition ("PECVD"). Alternatively, layer 60 may be formed by a thermal CVD process using ozone ($O_3$) as a reaction species. Next, a preferably thick layer of spin-on-glass ("SOG") 70 is spun onto the structure in liquid form to even-out the topography. As will be described, after SOG etch back, a conventional cap oxide layer 80 is formed over the planarized surface.

For ease of illustration in FIG. 2A (as well as FIGS. 2B, 3A, 3B), the upper surface of layer 30 is depicted in a substantially horizontal plane. In reality, due to underlying topography the upper surface of layer 30 may in fact undulate. As a result, the uppermost surface of some of the metal 1 traces may differ in height from one another. That is to say, for example, that the uppermost surface of M1C may in fact be at a higher level than the uppermost surface of M1A.

Due to the nature of the CVD process, the TEOS-based oxide layer 60 thickness will not depend upon the height of the top of the metal 1 traces. However the amount of SOG 70 atop the metal traces will depend upon the height of the TEOS-based oxide. Spin on characteristics of the liquid SOG are such that the thickness of the SOG 70 will depend upon the height of the underlying TEOS-based oxide layer. For example, if the upper surface of M1C were higher than the upper surface of M1A, the liquid nature of the SOG would result in more SOG being present atop M1A than would be present atop M1C.

To improve reliability of the via 50 and to improve the properties of the underlying device 10, the SOG 70 is then etched-back, for example to the depth noted by the phantom line D. Ideally level D is located at depth where no SOG remains above the metal 1 traces and the metal 1 traces are not exposed by the etching process. However, if too little SOG is etched away and the resultant depth is D" (see FIG. 2A), some SOG remains above the metal 1 traces M1A, M1B, M1C, and the reliability of via 50 and device 10 can be degraded, as will be described. Similarly, if too much SOG is etched away and the resultant depth is D', the metal 1 traces are exposed, which can degrade the planarization and affect the performance and yield of device 10.

As noted above, undulations can exist at the upper surface of layer 30 that result in variations in the height of the top of the metal 1 traces, and in variations of the thickness of the SOG overlying these traces. These variations in metal 1 heights and in SOG thicknesses impose even more stringent requirements in meeting the twin goals of leaving no SOG atop metal 1 traces, while not exposing the upper surface of any metal 1 traces during etch back. Understandably, the level of D' must be above the highest of the metal 1 traces.

Ensuring that the etch-back depth is D rather than D' or D" under all process scenarios is not a simple task in the prior art. In overview, a large layer 60 thickness (TEOS or equivalent) is desired to better protect the metal 1 traces against exposure during etching, e.g., against a D' scenario (see FIG. 2A). However as shown in FIG. 1C, if layer 60 is too thick, voids can result that degrade planarization and device 10 performance. Good planarization dictates that the SOG layer 70 be thick, with preferably as much SOG being is etched away as was deposited. Controlling the etch depth D is complicated because when the etching process exposes the TEOS-based oxide layer, oxygen atoms therein become liberated and accelerate the rate of SOG etching by about 100%. Thus, in practice the SOG layer should be about half the thickness of the TEOS-based oxide layer 60 to compensate for the differential etching rate between SOG and TEOS-based oxide, and for the variation in thickness of the SOG overlying metal 1 traces. These various considerations will now be described in detail.

The ability of layer 60 material to uniformly coat a metal trace, e.g., M1A, M1B, etc., is commonly referred to as step coverage. Ideally layer 60 (TEOS-based oxide or equivalent) should conform perfectly to the profile of the metal 1 trace, providing as much step coverage in the horizontal dimension as in the vertical dimension. In practice, however, while TEOS-based oxide is a relatively conformal material providing a non re-entrant profile, the sidewall coverage is only about 55% of the horizontal coverage. Stated differently, if the TEOS-based oxide deposited a layer 100 units thick atop the metal 1 trace, the sidewall coverage along the vertical wall of the metal 1 trace would be 55 units.

With respect to FIG. 1B, as the closest pitch distance Lx between adjacent metal 1 traces becomes smaller, the ability of layer 60 of thickness T1 to conformally coat the metal 1 profile horizontally and vertically becomes more important. This is especially true in structures wherein Lx is $<1$ $\mu$m or 10,000 Å ("sub-micron" structures) and more so where Lx is $<0.5$ $\mu$m or 5,000 Å ("deep sub-micron" structures). The step coverage depicted in FIG. 1B is acceptable, and provides a so-called non re-entrant profile, which means that no voids or gaps are formed in layer 60 between adjacent metal traces.

By contrast, FIG. 1C depicts a re-entrant profile situation with inadequate layer 60 step coverage. Such profiles can result where Lx is too small, or where layer 60's thickness T2 is too large relative to Lx. Re-entrant profiles are not acceptable because as the layer 60 material fills the narrow "valley" between adjacent metal traces M1A and M1B, a narrow gap 90 can form. If too narrow, such gaps 90 are not filled by the subsequently applied SOG layer 70, and the resultant voids can detrimentally affect planarization and device 10 performance. It is for this reason that chemical vapor deposition of $SiH_4$-based films cannot be used in sub-micron structures.

FIG. 2B depicts the ideal case where the structure of FIG. 2A has had the SOG layer 70 etched-back to the level defined by D. A conventional cap oxide layer 80 that may be TEOS-based oxide or $SiH_4$-based oxide is then formed over the planarized surface defined by level D. Via 50 and metal layer 2 traces may then be formed. It will be appreciated that cap oxide layer 80 advantageously prevents a metal 2 trace from detrimentally being in direct contact with SOG 70. Thus, after planarization is complete and before any metal 2 traces or vias 50 are formed, IMO 40 comprises typically three layers, namely layers 60, 70 and 80.

It is important to appreciate from FIG. 2B that after etch-back to level D, pockets of SOG 70 that fill voids between adjacent metal 1 traces may remain, but no SOG is permitted to remain over a metal 1 trace. SOG overlying a metal 1 trace can cause formation of positive charges that can degrade device reliability and degrade hot carrier device characteristics. Further, where a via is to couple a metal 1 trace to an overlying metal 2 trace (see for example via 50 in FIG. 1A), any intervening SOG overlying the metal 1 trace could outgas during via metal deposition, degrading via reliability.

Unfortunately, variations in the thickness of the SOG layer 70 or TEOS-based oxide layer 60, as well as variations in the etch-back process create uncertainty as to where precisely the D level will end up. For example, on a flat wafer region the thickness of the SOG layer 70 can vary perhaps ±5% and on a non-flat region can vary almost from zero Å to the nominal thickness of the SOG overlying a metal trace, and the TEOS-based oxide layer thickness can vary perhaps ±3%. The etcher mechanism itself may contribute ±5% variation in the etching process. Day-to-day wafer variations can contribute another ±10% uncertainty to the etch-back process. Further, the SOG etch rate is especially sensitive to wafer temperature and etch chamber cleanliness.

In practice, to maintain the location of the D level in a desired range (e.g., so that neither metal 1 traces are exposed nor does SOG 70 remain atop a metal 1 trace) requires controlling etch uniformity within one sigma of ±5%. This ±5% or more uncertainty in the etch-back process, combined with variations in the depth of the SOG layer, means that too little SOG, or too much SOG and TEOS-based oxide may be removed. Stated differently, the margin of error associated with etching-back must not result in the removal of too little SOG, or too much SOG and TEOS-based oxide.

With reference to FIG. 2A, removing too little SOG could put the etched-back surface not at level D but at level D", a condition wherein SOG undesirably remains over the metal 1 traces. On the other hand, removing too much SOG and TEOS-based oxide could put the etched-back surface not at level D but at level D', a condition undesirably exposing the metal 1 traces. Exposing the metal 1 traces would result in degraded planarization and degraded device 10 performance and yield.

As such, D" and D' demark just beyond the acceptable margin of error tolerances associated with the etch-back process. If D' were sightly shallower as to not expose the metal 1 traces, or if D" were slightly deeper as to remove all SOG overlying the metal 1 traces, the etch-back process would be operating within an acceptable margin of error.

Reliably ensuring that etch-back halts at the D level is complicated by the fact that the SOG etch rate is not constant. With reference to FIG. 2A, SOG etching typically proceeds at a constant rate through the level D", since only one type of material is being etched, SOG 70. However, as soon as the etching process begins to expose the underlying TEOS-based oxide layer 60, the rate of SOG etch increases substantially. This acceleration in the SOG etch rate results from the presence of oxygen atoms that are liberated from the exposed TEOS-based oxide layer.

To maintain good planarization, it is necessary to compensate for this accelerated etch phenomenon. It is known in the prior art that making the etch rate for the TEOS-based oxide layer 60 about twice the etch rate for the SOG can compensate for these etch effects. In practice, a typical etch-back rate for SOG (in the absence of liberated oxygen atoms) might be 50 Å/second, whereas the etch-back rate for TEOS-based oxide is about 100 Å/second. However, as the etch-exposed TEOS-based oxide liberates oxygen atoms, the SOG etch rate increases to about 100 Å/second, with the result that both the SOG and TEOS-based oxide materials then etch at about the same rate.

This differential etch-back rate further implies that to remove, say, a 3,000 Å thick layer of SOG, the TEOS-based oxide layer 60 should be at least 6,000 Å thick. Understandably, increasing the thickness of the TEOS-based oxide layer can ensure that the metal 1 traces are never exposed, thus providing an increased margin of error for the etch-back process. Unfortunately, however, too thick a TEOS-based oxide layer 60 can result in voids 90 in sub-micron devices, as suggested by FIG. 1C.

Thus, in practice, where the metal 1 traces have a vertical thickness on the order of 0.7 μm (7,000 Å), and where Lx is approximately 0.5 μm (5,000 Å), the TEOS-based oxide 60 layer cannot be thicker than about 5,000 Å to about 7,000 Å. A 5,000 Å to 7,000 Å thick TEOS-based oxide layer dictates that the SOG layer should be about 2,500 Å to about 3,000 Å thick, e.g., about half the TEOS-based oxide thickness. In practice, for metal traces horizontally spaced less than about 1 μm apart, 3,000 Å is approximately the thickest layer of SOG than can be spun-on to achieve good planarization.

However, as noted, uncertainties in the etching process may readily cause perhaps 15%×3,000 Å, or ±900 Å (three sigma) too little or too much SOG to be removed. Although the prior art attempts to carefully control the margin of error associated with the etch-back process, the end result is still a very narrow process window.

What is needed is a method of providing a greater useful margin of error in the etch-back planarization of submicron devices. Such method should provide a buffer mechanism that inhibits plasma oxide etch rate as the etching process approaches the metal 1 traces. Preferably such method should be compatible with existing fabrication processes, and should improve yield and device reliability.

The present invention discloses such a method.

SUMMARY OF THE PRESENT INVENTION

The present invention provides a void-free method of planarizing sub-micron and deep sub-micron semiconductor devices. After conventional formation of the device and metal 1 traces, a perhaps 1,000 Å to 2,000 Å thick layer of silicon-enriched oxide is deposited over the structure. The silicon-enriched oxide has an index of refraction of at least about 1.50, a dangling bond density of about $10^{17}/cm^3$, and is typically about 1,000 Å to 2,000 Å thick. Conventional layers of TEOS-based oxide and SOG are then applied over the layer of silicon-enriched oxide, and device fabrication is completed as in the prior art.

Because it is relatively deficient in oxygen atoms, the silicon-enriched oxide releases relatively few oxygen atoms when exposed by the etching process. The relatively few liberated oxygen atoms do not accelerate the SOG etch rate. Further, the etch rate of the silicon-enriched oxide itself is only about 75% the etch rate of stoichiometric oxide, e.g., TEOS-based oxide. As such, the silicon-enriched oxide acts as a buffer that slows the etch-back process as the etching approaches the level of the metal 1 traces, thus protecting the metal 1 traces against exposure. For a given thickness of silicon-enriched oxide plus TEOS-based oxide, the present invention advantageously provides a greater leeway or etch-back margin of error when contrasted with prior art techniques.

In addition to acting as an etching buffer, the silicon-enriched oxide advantageously promotes stability and reliability of the underlying device. The silicon-enriched oxide performs a shield-like function by neutralizing charges that could influence the underlying semiconductor device. Further, the silicon-enriched oxide can also extend hot carrier lifetime by about one order of magnitude.

Other features and advantages of the invention will appear from the following description in which the preferred embodiments have been set forth in detail, in conjunction with the accompanying drawings.

DETAILED DESCRIPTION OF THE PREFERRED EMBODIMENT

Figure 3A:
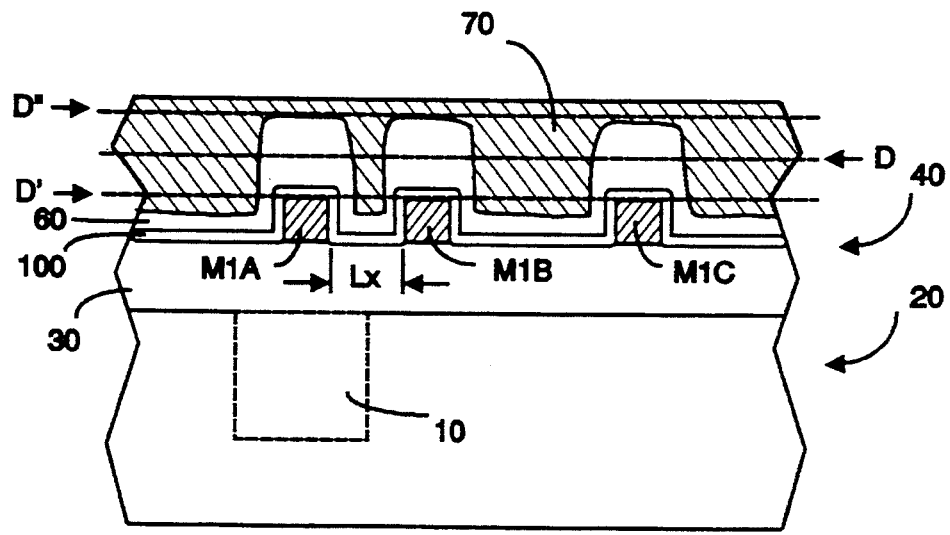
FIG. 3A depicts depositions of silicon-enriched oxide, TEOS-based oxide and SOG overlying the metal 1 layer of a semiconductor device, according to the present invention.

According to the present invention, a semiconductor device 10 is formed on a substrate 20 in the conventional manner, through and including formation of the metal 1 traces. However as shown in FIG. 3A, a layer 100 of silicon-enriched oxide is then deposited over the device and metal 1 traces, after which layers of TEOS-based oxide 60 and SOG 70 may be deposited in a conventional fashion. Silicon-enriched oxide is non-stoichiometric, e.g., $SiO_x$ where $x<2$.

Silicon-enriched oxide layer 100 is preferably formed using plasma deposition (e.g., r.f. power plasma) to a thickness of 1,000 Å to about 2,000 Å or more. Because layer 100 is relatively thin, it advantageously does not fill much of the "valley" between adjacent metal 1 lines, e.g., M1A, M1B. The presence of layer 100 is essentially transparent to the subsequent TEOS-based oxide layer 60, which can still fill the valley without degradation of the TEOS-based oxide step coverage. Thus, the final profile remains non re-entrant, even for sub-micron or deep sub-micron device fabrication.

Deposition of layer 100 preferably is accomplished with a commercially available PECVD reactor, at about 400° C., and a pressure of about 2 Torr. The reactant gases preferably used are silane ($SiH_4$), nitrous oxide ($N_2O$), and nitrogen ($N_2$), the deposition conditions being modified to enrich the PECVD oxide with silicon. Because more silicon-bearing reagent is used than is required for stoichiometric interaction with the introduced oxidant, the resultant deposition layer 100 is silicon-enriched, which is to say, oxygen deficient.

Because it is oxygen deficient and etches more slowly, during etch-back of the SOG 70 and TEOS-based oxide 60 layers, the silicon-enriched layer 100 acts as an etching buffer as the etch level approaches the metal 1 traces. More specifically, if the etching process etches into layer 100, relatively few oxygen atoms will be liberated, with the result that no rapid acceleration of SOG etch rate occurs, as in the prior art. Further, the etch rate of silicon-enriched oxide is only perhaps 75

Å/second, as contrasted with about 100 Å/second for TEOS-based oxide, which is a stoichiometric oxide. The etchback buffer function of layer 100 advantageously permits a greater degree of process variation.

Preferably layer 100 has a refractive index of at least about 1.50 (measured with an ellipsometer) and a spin density of dangling bonds available on silicon atoms preferably exceeding at least about $10^{17}/cm^3$, with about $10^{19}$ per $cm^3$ preferred (measured with an electron paramagnetic spin resonance spectrometer). For stoichiometric silicon oxide, the corresponding data would be less, for example a refractive index of about $1.46 \pm 0.02$, and a spin density of less than about $10^{16}$ per $cm^3$.

Applicants' silicon-enriched oxide 100 has a preferred Si-H absorbance of at least about 0.010, contrasted with about 0.001 or less for stoichiometric oxide, as measured in the infrared spectrum as a peak located near the wave number 2250 for a 1.0 micron thick film. In practice, a Si-H of about 0.005 or higher will enhance device hot carrier lifetime by about an order of magnitude as compared to a similar device having no silicon-enriched layer 100.

As Si-H content increases, the refractive index and dangling bond spin densities both increase. Stoichiometric $SiO_2$ with nearly zero percent Si-H content corresponds with a refractive index of 1.452. Dangling bond spin density measurements indicate orders of magnitude higher spin densities for silicon-enhanced oxides having higher Si-H contents. The g-value of the silicon-enhanced oxide is in the range of about 2.005 and 2.006, as contrasted with a g-value of about 2.001 for stoichiometric oxide. The 2.005 to 2.006 range correlates well with reported data wherein a first resonant line is attributed to dangling bonds in an amorphous silicon environment, and a second line is attributed to the dangling bonds at the interface between amorphous silicon and $SiO_2$ components. It is noted that at least where charge neutralization is concerned, internal passivation depends more on the defect type than the total spin densities.

The PECVD silicon-enriched oxide 100 may be characterized using FTIR measurements in addition to refractive index, stress and wet etch rates. Si-O-Si stretch band position, full width at half-maximum for Si-O-Si stretch band, Si-H peak position and Si-H peak heights are useful measurements, as are electron spin density measurements, to estimate dangling bond density.

The advantages of silicon-enriched oxide in improving device reliability and performance are disclosed in U.S. Pat. No. 5,290,727, assigned to the assignee of the present invention. Some benefits associated with the use of silicon-enriched oxide in improving planarization are disclosed in U.S. patent application Ser. No. 07/893,616, filed Jun. 5, 1992, by several applicants herein, and assigned to the assignee of the present invention. However, said application did not address planarization issues encountered in submicron and deep submicron technologies.

Figure 1A:
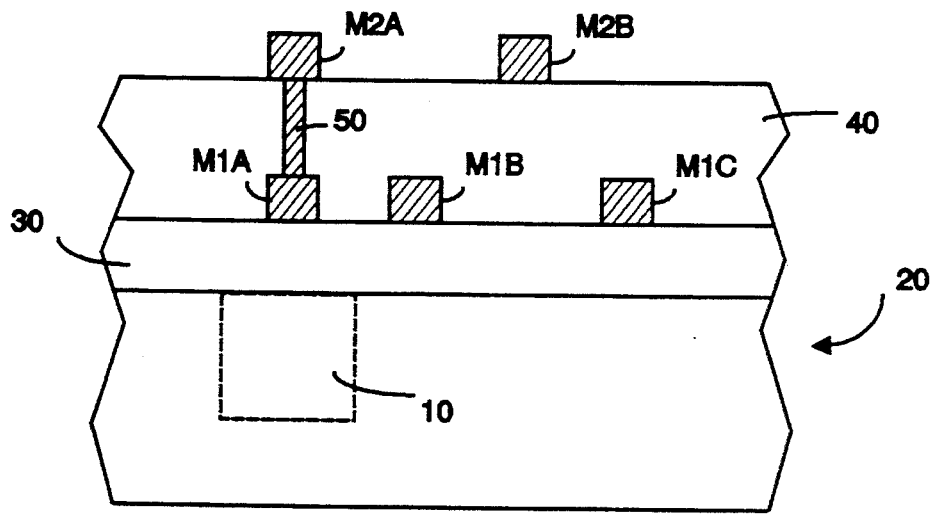
FIG. 1A depicts a semiconductor device having first and second layers of metallization, according to the prior art.
Figure 1B:
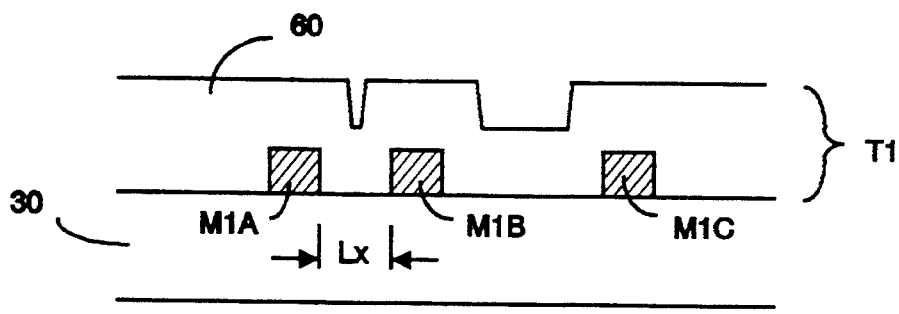
FIG. 1B depicts non re-entrant profile step coverage of TEOS-based oxide, according to the prior art.
Figure 1C:
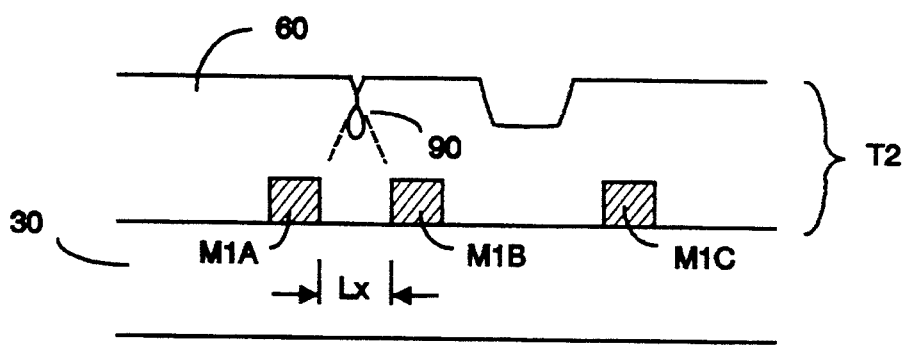
FIG. 1C depicts void re-entrant step coverage of TEOS-based oxide or silane-based oxide, according to the prior art.
Figure 4:
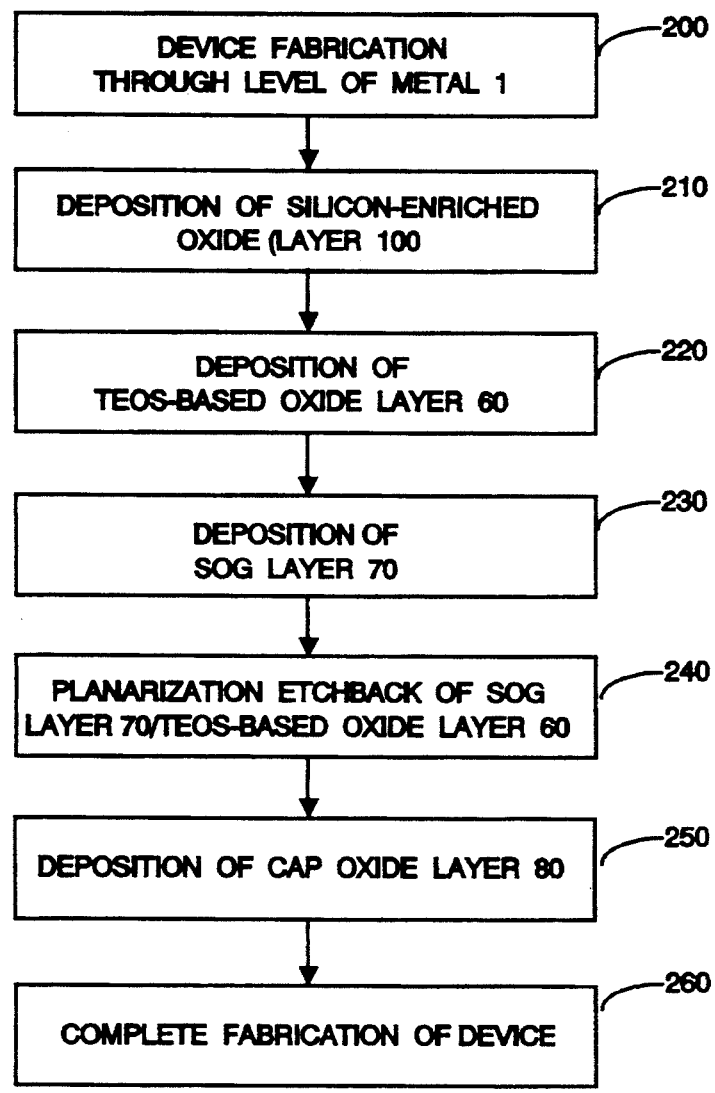
FIG. 4 is a flow chart depicting process steps, according to the present invention.

With reference to FIG. 4, step 200 represents fabrication of a device 10 upon a substrate 20, through the formation of an inter-level dielectric layer 30 and formation of the metal 1 traces, e.g., M1A, M1B, etc., as shown in FIG. 1A. The various fabrication steps culminating in process step 200 are common in the prior art.

It is understood of course that in practice an integrated circuit wafer containing many devices 10 is being formed.

However at process step 210, according to the present invention a deposition of silicon-enriched oxide 100 is made upon the substrate 20 that includes device 10, ILD layer 30 and metal 1 traces. The preferred characteristics of layer 100 have been described above. As an alternative to silicon-enriched oxide, layer 100 could use SiN as an etch back buffer provided that the SiN could be optimized not to have large amounts of hydrogen. Those skilled in the art will appreciate that to deposit SiN directly atop metal 1 traces is not desired as hydrogen atoms associated with the SiN could interact with the metal, creating undesired voids in the metal traces.

At step 220, a TEOS-based oxide layer 60 is deposited in the conventional fashion, typically with a thickness of 4,000 Å to perhaps 6,000 Å. The TEOS-based oxide is of course a stoichiometric oxide, and has a plasma etch rate of perhaps 100 Å/second. At step 230, SOG 60 is spun-on in the conventional fashion, preferably to a thickness approximately half the thickness of TEOS-based oxide (or equivalent) layer 60, e.g., 2,000 Å to perhaps 3,000 Å. Typically SOG 60 has an etch rate of perhaps 50 Å/second.

At step 240, planarization etchback of the SOG and TEOS-based oxide layers 70, 60 occurs using conventional etching procedures and equipment. With reference to FIG. 3A, before level D" is reached, what is being etched is SOG 70, etching occurring at a reasonably constant rate, perhaps 50 Å/second. As the etching process continues, regions of TEOS-based oxide 60 are etched, and the resultant liberated oxygen atoms will accelerate the SOG etch rate, as has been described.

If etching continues beyond the level D, toward level D', the silicon-enriched layer 100 will begin to be exposed. However, as noted relatively few oxygen atoms will be released, thus avoiding the rapid acceleration of SOG etch rate found in the prior art. Further, because the etch rate of layer 100 per se is less than the etch rate of the TEOS-based oxide, the etch back process begins to slow as level D' comes closer to exposing the metal 1 traces.

Thus, layer 100 acts as an etch back buffer that protects the metal 1 traces M1A, M1B, M1C against exposure due to excessive etching. Layer 100 automatically slows the rate of oxide etching as the etch level gets closer to exposing metal 1 traces. Stated differently, the presence of layer 100 advantageously provides an increased etch-back process margin for the same total base oxide thickness, e.g., thickness of layer 100 plus TEOS-based oxide layer 60.

Figure 2A:
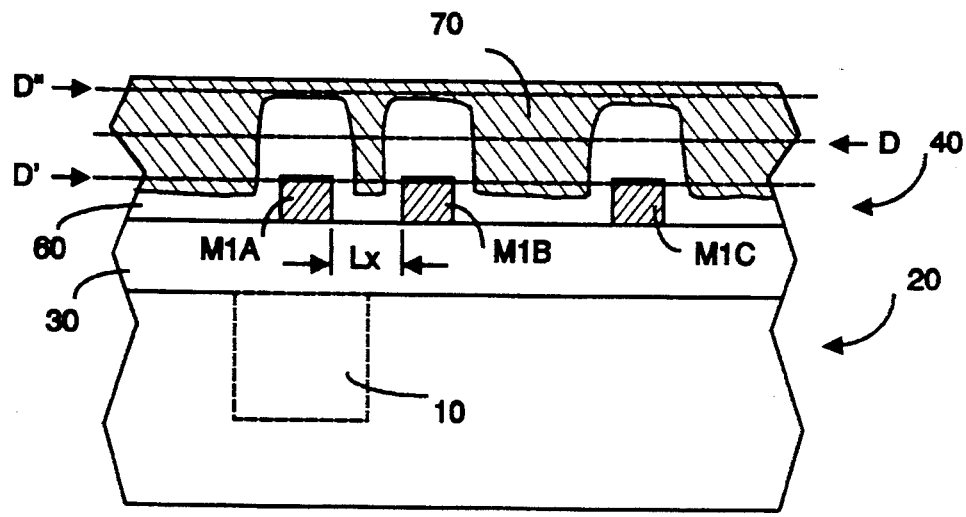
FIG. 2A depicts depositions of TEOS-based oxide and SOG overlying the metal 1 layer of a semiconductor device, according to the prior art.
Figure 2B:
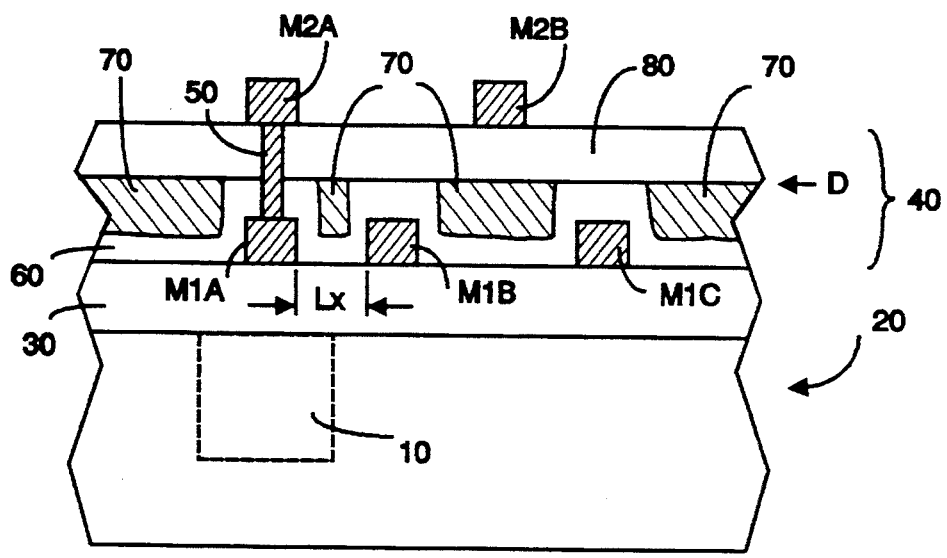
FIG. 2B depicts the semiconductor device of FIG. 2A, after etch-back, according to the prior art.

Thus, in contrast to prior art fabrication techniques wherein etchback all too easily can expose the metal 1 traces (e.g., etchback to level D' in FIG. 2A), the presence of layer 100 according to the present invention reduces such likelihood by slowing, rather than accelerating, the etchback process as level D' is approached.

For a given level of process and etching control, the present invention will produce a higher yield because fewer devices will be fabricated with exposed metal 1 traces. Of course, where lower yields approximating those achieved using prior art techniques can be tolerated, the present invention could permit an increase of the process and etching tolerances.

With further reference to FIG. 4, at step 250, the cap oxide layer 80 is deposited in conventional fashion. At step(s) 260, fabrication of device 20 including formation of vias, metal 2 traces and backend processing is accomplished, in conventional fashion.

As noted, the presence of layer 100 advantageously provide a greater equivalent thickness of oxide that promotes etchback margin tolerance. However, in addition to providing an etchback buffer function, layer 100 also promotes reliability and stability of device 10.

Figure 3B:
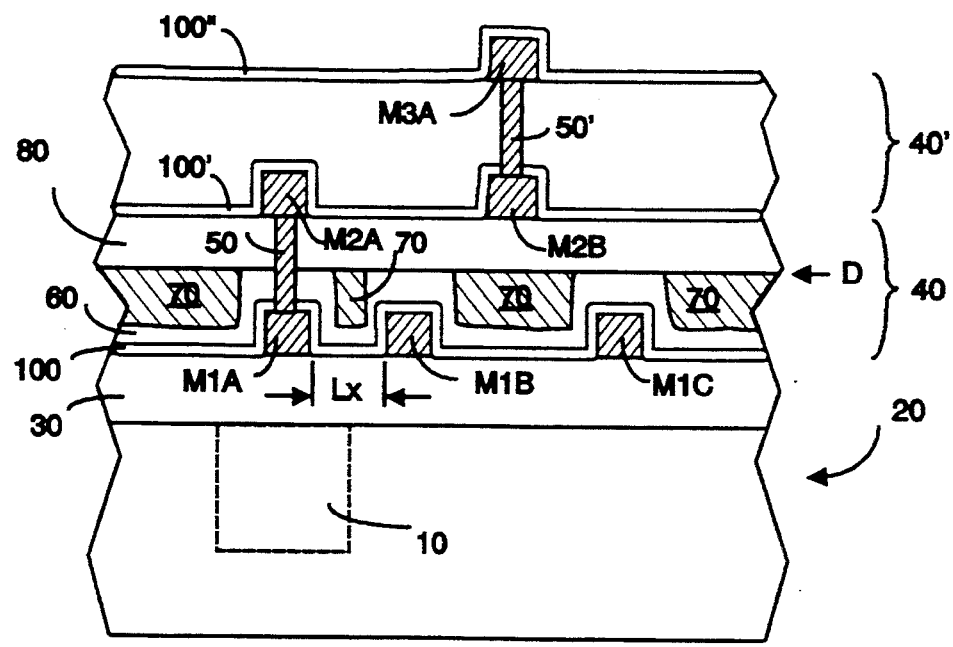
FIG. 3B depicts the semiconductor device of FIG. 3A, after etch-back and fabrication of additional, optional, layers, according to the present invention.

It will be appreciated that the present invention may advantageously be practiced with devices 10 having more than two levels of metal traces. This is denoted generally in FIG. 3B, wherein level two traces M2A, M2B are formed, atop which a second layer of silicon-enriched oxide 100' is deposited. Thereafter an inter-metal oxide layer 40' is formed, comprising TEOS-based oxide layer 60' and SOG layer 70', which are planarized, and an overlying cap oxide layer 80'. For ease of illustration, layers 60', 70', 80' are not depicted in FIG. 3B. Thereafter via 50' and level 3 traces are formed (e.g., M3A), whereupon a third layer of silicon enriched-oxide 100'' is deposited. FIG. 3B does not depict the complete fabrication of device 10, including backend processing.

Modifications and variations may be made to the disclosed embodiments without departing from the subject and spirit of the invention as defined by the following claims.

What is claimed is:

1. A method enhancing planarization etchback margin and improving reliability and stability of an integrated circuit, the method comprising the following steps:
   (a) forming on a substrate said integrated circuit including said at least one semiconductor device, and forming at least first and second traces at a first metal level on said substrate;
   (b) depositing a layer of silicon-enriched oxide over said first metal level on said substrate;
   (c) depositing a preliminary inter-metal oxide layer overlying said layer of silicon-enriched oxide, including (i) forming a layer of tetra-ethyl-ortho-silicade-based ("TEOS-based") oxide and (ii) forming a layer of spin-on-glass ("SOG") overlying said TEOS-based oxide layer; and
   (d) etching back said preliminary layer of inter-metal oxide to planarize said integrated circuit;
   wherein as step (d) approaches said first metal level, said silicon-enriched oxide slows step (d), and
   wherein said layer of silicon-enriched oxide improves reliability and stability of said integrated circuit by neutralizing charges and increasing hot carrier lifetime.

2. The method of claim 1, wherein step (b) is carried out with at least one parameter selected from the group consisting of (i) using plasma enhanced chemical vapor deposition ("PECVD"), and (ii) using silane, nitrous oxide and nitrogen gases.

3. The method of claim 1, wherein at step (c), said layer of tetra-ethyl-ortho-silicade-based oxide has a thickness in the approximate range 4,000 Å to 6,000 Å, and said layer of spin-on-glass has a thickness approximating half the thickness of said TEOS-based oxide.

4. The method of claim 1, wherein at step (c), said layer of tetra-ethyl-ortho-silicate-based oxide has a thickness in the approximate range of 250% to 400% the thickness of said silicon-enriched oxide layer, and said layer of spin-on-glass has a thickness approximating 50% the thickness of said layer of tetra-ethyl-ortho-silicate-based oxide.

5. The method of claim 1, wherein said first and second metal traces are separated horizontally by less than about 5,000 Å.

6. The method of claim 1, including the further step of:
   (e) forming a cap oxide layer atop said preliminary inter-metal oxide layer after step (d) is complete.

7. The method of claim 6, including the further step of:
   (f) forming at least one via through said cap oxide layer and said preliminary inter-metal oxide layer;
   (g) forming at least one trace at a second metal level, said second metal level overlying said cap oxide layer.

8. The method of claim 7, including the further step of:
   (h) depositing a layer of said silicon-enriched oxide over said at least one second metal level trace.

9. The method of claim 1, wherein at step (b), said layer of silicon-enriched oxide has an index of refraction of at least about 1.50.

10. The method of claim 10, wherein at step (b), said layer of silicon-enriched oxide contains about $10^{17}$ per $cm^3$ dangling bonds.

11. The method of claim 1, wherein at step (b), said layer of silicon-enriched oxide contains has a thickness in the approximate range 1,000 Å to 2,000 Å.

12. The method of claim 1, wherein said semiconductor device is sub-micron in size.

* * * * *